US009791771B2

(12) United States Patent
Qi et al.

(10) Patent No.: US 9,791,771 B2
(45) Date of Patent: Oct. 17, 2017

(54) PHOTOMASK STRUCTURE WITH AN ETCH STOP LAYER THAT ENABLES REPAIRS OF DETECTED DEFECTS THEREIN AND EXTREME ULTRAVIOLET(EUV) PHOTOLITHOGRAPY METHODS USING THE PHOTOMASK STRUCTURE

(71) Applicant: GLOBALFOUNDRIES INC., Grand Cayman (KY)

(72) Inventors: Zhengqing John Qi, Essex, VT (US); Jed H. Rankin, Richmond, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 27 days.

(21) Appl. No.: 15/041,476

(22) Filed: Feb. 11, 2016

(65) Prior Publication Data

US 2017/0235217 A1   Aug. 17, 2017

(51) Int. Cl.
*G03F 1/22* (2012.01)
*G06F 17/50* (2006.01)
(Continued)

(52) U.S. Cl.
CPC .................. *G03F 1/22* (2013.01); *G03F 1/72* (2013.01); *G06F 17/5081* (2013.01); *G03F 1/24* (2013.01);
(Continued)

(58) Field of Classification Search
CPC ..... G03F 1/24; G03F 1/72; G03F 1/84; G03F 1/22; G03F 1/80; G03F 7/11; G03F 1/48;
(Continued)

(56) References Cited

U.S. PATENT DOCUMENTS 5,958,629 A     9/1999  Yan et al.
6,297,169 B1 *  10/2001 Mangat .................. B82Y 10/00
                                                378/35
(Continued)

OTHER PUBLICATIONS

Sang-In Han et al., "Design and Method of Fabricating Phase Shift Masks for Extreme Ultraviolet Lithography by Partial Etching into the EUV Multilayer Mirror", Emerging Lithographic Technologies VII, Roxann L. Engelstad, Editor, Proceedings of SPIE vol. 5037 (2003) © 2003 SPIE , pp. 314-330.

*Primary Examiner* — Helen Rossoshek
(74) *Attorney, Agent, or Firm* — Gibb & Riley, LLC; Michael J. LeStrange, Esq.

(57) ABSTRACT

Disclosed are a repairable photomask structure and extreme ultraviolet (EUV) photolithography methods. The structure includes a multilayer stack, a protective layer above the stack and a light absorber layer above the protective layer. The stack includes alternating layers of high and low atomic number materials and a selected one of the high atomic number material layers is different from the others such that it functions as an etch stop layer. This configuration allows the photomask structure to be repaired if/when defects are detected near exposed surfaces of the multilayer stack following light absorber layer patterning. For example, when a defect is detected near an exposed surface of the stack in a specific opening in the light absorber layer, the opening can be selectively extended down to the etch stop layer or all the openings can be extended down to the etch stop layer in order to remove that defect.

20 Claims, 11 Drawing Sheets

(51) Int. Cl.
*G03F 1/72* (2012.01)
*G03F 1/24* (2012.01)
*G03F 7/20* (2006.01)
*G03F 1/84* (2012.01)
*G03F 7/11* (2006.01)
*G03F 1/80* (2012.01)

(52) U.S. Cl.
CPC .............. *G03F 1/80* (2013.01); *G03F 1/84* (2013.01); *G03F 7/11* (2013.01); *G03F 7/7065* (2013.01)

(58) Field of Classification Search
CPC ... G03F 7/7065; G03F 7/7085; G06F 17/5081
See application file for complete search history.

(56) References Cited

U.S. PATENT DOCUMENTS

| | | | |
|---|---|---|---|
| 6,440,615 B1* | 8/2002 | Shimizu | G03F 1/20 430/5 |
| 6,905,801 B2* | 6/2005 | Liang | B82Y 10/00 430/5 |
| 6,908,713 B2* | 6/2005 | Silverman | B82Y 10/00 430/5 |
| 6,908,714 B2* | 6/2005 | Yan | B82Y 10/00 430/5 |
| 6,914,723 B2* | 7/2005 | Yun | G01N 21/956 359/350 |
| 7,407,729 B2* | 8/2008 | Schwarzl | B82Y 10/00 430/5 |
| 7,410,733 B2* | 8/2008 | Yan | C03C 17/36 430/5 |
| 7,474,733 B1* | 1/2009 | Yamamoto | B82Y 10/00 359/359 |
| 7,781,128 B2* | 8/2010 | Constancias | B82Y 10/00 430/5 |
| 7,927,767 B2* | 4/2011 | Ahn | B82Y 10/00 430/5 |
| 8,460,842 B2* | 6/2013 | Ogawa | G03F 1/24 250/309 |
| 8,546,776 B2 | 10/2013 | Ehm et al. | |
| 8,891,163 B2 | 11/2014 | Trenkler et al. | |
| 9,057,960 B2* | 6/2015 | Bozano | G03F 7/0392 |
| 9,075,316 B2 | 7/2015 | Singh | |
| 9,310,675 B2* | 4/2016 | Huang | G03F 1/80 |
| 9,378,858 B2* | 6/2016 | Aramaki | H01J 37/08 |
| 2002/0115000 A1 | 8/2002 | Gupta et al. | |
| 2006/0166109 A1* | 7/2006 | Yan | B82Y 10/00 430/5 |
| 2006/0222961 A1* | 10/2006 | Yan | B82Y 10/00 430/5 |
| 2013/0260288 A1 | 10/2013 | Yu et al. | |
| 2013/0323626 A1* | 12/2013 | Chang | G03F 1/24 430/5 |
| 2014/0038088 A1 | 2/2014 | Lee et al. | |
| 2014/0038090 A1* | 2/2014 | Lu | G03F 1/52 430/5 |
| 2014/0063490 A1* | 3/2014 | Zhang | G01J 1/4257 356/121 |
| 2014/0268091 A1 | 9/2014 | Lu et al. | |
| 2014/0272687 A1* | 9/2014 | Gallagher | G03F 1/22 430/5 |
| 2015/0037712 A1* | 2/2015 | Shih | G03F 1/22 430/5 |
| 2015/0072270 A1* | 3/2015 | Yu | G03F 1/72 430/5 |
| 2015/0160548 A1* | 6/2015 | Mikami | G03F 1/24 430/5 |
| 2015/0227037 A1* | 8/2015 | Hsueh | G03F 1/20 438/700 |
| 2017/0003419 A1* | 1/2017 | Jaiswal | G21K 1/062 |

* cited by examiner (i.e., The 1st Layer In The Nth Pair Of Layers Is Replaced With An Etch Stop Layer And Reflectivity Is Measured Prior To A Repair)

(i.e., The 1st Layer In the *Nth* Pair of Layers Is Replaced With An Etch Stop Layer And Reflectivity Is Measured Following A Repair).

PHOTOMASK STRUCTURE WITH AN ETCH STOP LAYER THAT ENABLES REPAIRS OF DETECTED DEFECTS THEREIN AND EXTREME ULTRAVIOLET(EUV) PHOTOLITHOGRAPY METHODS USING THE PHOTOMASK STRUCTURE

FIELD OF THE INVENTION

The present invention relates to extreme ultraviolet (EUV) photolithography and, more specifically, to a photomask structure and EUV photolithography methods using the photomask structure.

BACKGROUND

The miniaturization of device components has become one of the key driving principles in enabling overall device scaling and, particularly, in enabling the production of increasingly compact devices with greater performance, reduced power consumption, and lower production costs. Advances in photolithography have, in part, enabled continued device scaling. Currently, extreme ultraviolet (EUV) photolithography is poised to complement and eventually replace conventional deep ultraviolet (DUV) photolithography due to the significantly narrower illumination wavelength used, providing enhanced patterning resolution and lower process complexity, among other benefits. For example, depending upon the platform used and the technology node at issue (e.g., the 7 nm technology node), EUV photolithography techniques employing an EUV light with a wavelength ($\lambda$) of 13.5 nm may be used to achieve a less than 10 nm half pitch resolution at a single exposure, whereas DUV photolithography employs a DUV light with a wavelength ($\lambda$) of 193 nm in order to achieve a minimum 40 nm half pitch resolution at single exposure.

Due to the considerable absorption of EUV radiation by all forms of matter, the optical elements used in EUV photolithography are based completely on reflective rather than refractive optics. Specifically, EUV photolithography techniques use a unique photomask structure. This photomask structure typically includes a substrate; a multilayer stack on the substrate; and a light absorber layer on the multilayer stack. The substrate can be formed of a low thermal expansion material (LTEM) (i.e., the substrate can be a LTEM substrate). The multilayer stack can be formed of alternating layers of high and low atomic number materials (i.e., EUV mirrors), which form a Bragg reflector for guiding and shaping EUV photons, and a protective layer above the alternating layers to prevent material degradation. The light absorber layer can be formed of a material that absorbs EUV light.

During EUV photolithography, the EUV light absorber layer of the photomask structure is patterned and etched to represent desired circuit features and can be subsequently exposed to EUV light. The EUV light is reflected off the photomask structure and directed so as to expose a target and, particularly, so as to expose a photosensitive layer above a feature layer to be patterned. By exposing the photosensitive layer to EUV light reflected off the photomask structure, the pattern of the etched light absorber layer is transferred into the photosensitive layer. It should be noted that the LTEM substrate prevents distortion of the reflected light due to heating of the photomask structure during exposure. In any case, after the pattern is transferred into the photosensitive layer, it can subsequently be transferred into the feature layer below.

Unfortunately, this reflective photomask design introduces a new class of defects not seen in previous mask technologies. Specifically, particles can become embedded in the multilayer stack during its formation (e.g., during thin film deposition) and these particles present as defects in the EUV mirrors of the Bragg reflector. Such defects can function as light absorbers, rather than being reflective, and can, thus, result in errors in the pattern transferred into the photosensitive layer and, subsequently, into the feature layer. In other words, such defects can negatively impact image formation and printing. Therefore, EUV photomask defectivity is a persistent obstacle that must be addressed in order to enable high volume manufacturing (HVM).

SUMMARY

Disclosed herein is a repairable photomask structure. The photomask structure can include a substrate. The photomask structure can further include a multilayer stack on the substrate. The multilayer stack can include alternating layers of high and low atomic number materials. That is, the multilayer stack can have multiple pairs of layers, wherein each pair includes a first layer and a second layer on the first layer and wherein the first layer has a higher atomic number than the second layer (i.e., the first layer has a relatively high atomic number and the second layer has a relatively low atomic number). For the most part, these pairs of layers are essentially identical. However, a selected first layer in a selected pair is made of a different material than that used in all the other first layers in all the other pairs. Specifically, each first layer in each pair, except the selected first layer in the selected pair, can be made of a first material, each second layer in each pair can be made of a second material that is different from the first material, and the selected first layer in the selected pair can be made of a third material that is different from both the first material and the second material. The third material can be specifically selected so that it has a relatively high atomic number (e.g., an atomic number similar to that of the first material), so that it can protect lower layers in the multilayer stack and so that is can function as an etch stop layer. The photomask structure can further include a protective layer on the multilayer stack. The protective layer can, for example, be made of the same third material as the selected first layer. The photomask structure can further include a light absorber layer on the protective layer.

Also disclosed herein are extreme ultraviolet (EUV) photolithography methods, which are performed using a repairable photomask structure. In one method, a repairable photomask structure, as described above, can be provided and the light absorber layer can be patterned and etched. That is, multiple openings can be formed that extend vertically through the light absorber layer to the protective layer. Following formation of the openings, the photomask structure can be inspected in order to detect any defects adjacent to exposed surfaces of the multilayer stack in the openings. When a defect is detected adjacent to an exposed surface of the multilayer stack within a specific opening in the light absorber layer, that defect can be selectively removed by selectively extending the specific opening down to the selected first layer. In another method, a repairable photomask structure, as described above, can be provided and the light absorber layer can be patterned and etched. That is, multiple openings can be formed that extend vertically through the light absorber layer to the protective layer. Following formation of the openings, the photomask structure can be inspected in order to detect any defects adjacent to exposed surfaces of the multilayer stack in the openings. When any defect is detected adjacent to any exposed surface in any opening, all of the openings can be extended down to the selected first layer.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
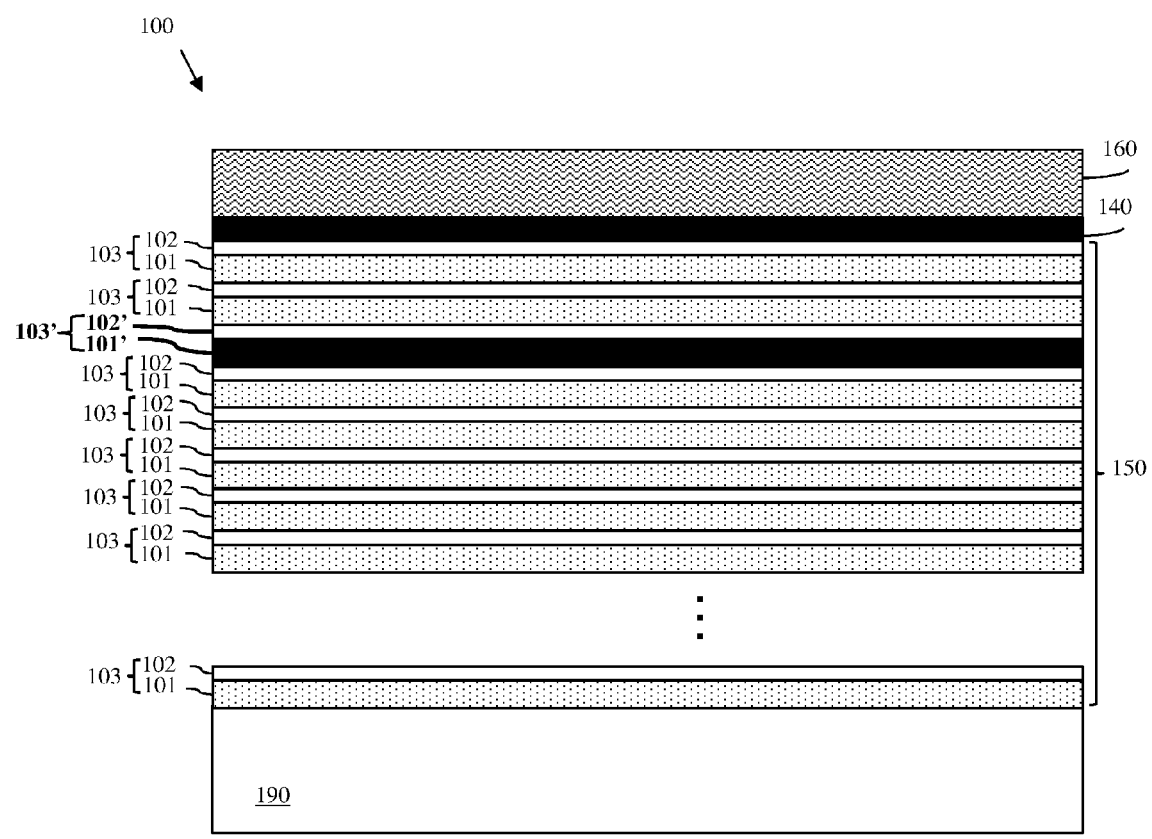
FIG. 1 is a cross-section diagram illustrating a repairable photomask structure.

As mentioned above, during EUV photolithography, the EUV light absorber layer of the photomask structure is patterned and etched to represent desired circuit features. Once the light absorber layer is patterned and etched, the photomask structure can be exposed to EUV light. The EUV light is reflected off the photomask structure and directed so as to expose a target and, particularly, so as to expose a photosensitive layer above a feature layer to be patterned. By exposing the photosensitive layer to EUV light reflected off the photomask structure, the pattern of the etched light absorber layer is transferred into the photosensitive layer. It should be noted that the LTEM substrate prevents distortion of the reflected light due to heating of the photomask structure during exposure. In any case, after the pattern is transferred into the photosensitive layer, it can subsequently be transferred into the feature layer below. Unfortunately, this reflective photomask design introduces a new class of defects not seen in previous mask technologies. Specifically, particles can become embedded in the multilayer stack during formation and these particles present as defects in the EUV mirrors of the Bragg reflector. Such defects can function as light absorbers, rather than being reflective, and can, thus, result in errors in the pattern transferred into the photosensitive layer and, subsequently, into the feature layer. In other words, such defects can negatively impact image formation and printing.

Various solutions are currently known for dealing with detected defects in the multilayer stack. For example, the multilayer stack may be completely removed and rebuilt. Alternatively, compensation techniques can be employed to avoid the negative impacts of these defects. For example, the light absorber layer can be patterned and etched in such a way that detected defects are covered by remaining portions of the light absorber layer. Unfortunately, it is often impossible to cover all detected defects with the remaining portions of the light absorber layer and oftentimes defects are not detected until after the light absorber layer has been patterned. Additionally or alternatively, the light absorber layer can be biased (i.e., thinned or removed in the area adjacent to the detected defect). Unfortunately, biasing the light absorber layer may not be sufficient to ensure that enough EUV light passes through the multilayer stack to compensate for the light absorption properties of the defect and too much biasing can introduce leakage of photons that may impact adjacent features. Alternatively, an atomic force microscopy (AFM) micromachining (also referred to as AFM nanomachining) process can be used to remove the defect. However, targeting a defect with AFM micromachining can result in the exposed surface of the Bragg reflector being jagged or rough and this jagged or rough surface can negatively impact image formation and printing.

In view of the foregoing, disclosed herein are a repairable photomask structure and extreme ultraviolet (EUV) photolithography methods using the repairable photomask structure. As with prior art photomask structures, the repairable photomask structure disclosed herein includes a multilayer stack, a protective layer above the multilayer stack and a light absorber layer above the protective layer. The multilayer stack includes alternating layers of high and low atomic number materials. However, in the multilayer stack of the disclosed repairable photomask structure, a selected one of the high atomic number material layers is different from the others such that it can function as an etch stop layer. This configuration allows the photomask structure to be effectively repaired if/when embedded defects are detected near exposed surfaces of the multilayer stack following light absorber layer patterning. For example, when a defect is detected near an exposed surface of the multilayer stack in a specific opening in the light absorber layer, the specific opening can be extended down to the etch stop layer in order to selectively remove that defect. Alternatively, when a defect is detected near any exposed surface of the multilayer stack in any opening in the light absorber layer, all the openings can be extended down to the etch stop layer.

More particularly, referring to FIG. 1, disclosed herein is a repairable photomask structure 100. This repairable photomask structure 100 includes a substrate 190, a reflective multilayer stack 150 on the substrate 190, a protective layer 140 on the multilayer stack 150 and a light absorber layer 160 on the protective layer 140.

The substrate 190 can be made of a low thermal expansion material (LTEM). That is, the substrate 190 can be a LTEM substrate. Those skilled in the art will recognize that thermal expansion refers to the tendency to change shape, area and volume in response to changes in temperature. Exemplary low thermal expansion materials that can be used for the substrate 190 include fused silica, fused quartz, calcium fluoride ($CaF_2$), silicon carbide, black diamond, silicon oxide-titanium oxide ($SiO_2$—$TiO_2$) alloy and/or any other suitable LTEM known in the art.

The multilayer stack 150 can include alternating layers of high and low atomic number materials. That is, the multilayer stack 150 can have multiple pairs 103 of layers, wherein each pair 103 includes a first layer 101 and a second layer 102 on the first layer 101 and wherein the first layer 101 has a higher atomic number than the second layer 102 (i.e., the first layer 101 has a relatively high atomic number and the second layer 102 has a relatively low atomic number). For the most part, these pairs 103 of layers are essentially identical. However, a selected first layer 101' below a selected second layer 102' in a selected pair 103' is made of a different material than that used in all the other first layers 101 in all the other pairs 103. Specifically, each first layer 101 in each pair 103, except the selected first layer 101' in the selected pair 103', can be made of a first material, each second layer 102 in each pair, including the selected second layer 102' in the selected pair 103', can be made of a second material that is different from the first material and from the light absorbing material(s) of the light absorber layer 160 (as discussed below), and the selected first layer 101' in the selected pair 103' can be made of a third material that is different from the first material, the second material and the light absorbing material(s) of the light absorber layer 160 (as discussed below). The third material can be specifically selected so that it has a relatively high atomic number (e.g., an atomic number similar to that of the first material), so that it can protect lower layers in the multilayer stack 150 and so that it can function as an etch stop layer. Thus, the selected first layer 101' is also referred to as the etch stop layer in the discussion below.

In an exemplary multilayer stack 150, the first material of all the first layers 101, except for the selected first layer 101' (i.e., except the etch stop layer), can be molybdenum with an atomic number of 42, the second material of all the second layers 102, including the selected second layer 102' of the selected pair 103', can be silicon with an atomic number of 14 or beryllium with an atomic number of 4. The third material of the selected first layer 101' (i.e., the etch stop layer) of the selected pair 103' can have different etching characteristics than the first material and the second material 102. The third material can have a third atomic number (or effective atomic number in the case of an alloy) that is closer to the atomic number of the first material than the atomic number of the second material. For example, the third material can be ruthenium with an atomic number of 44 or an alloy of ruthenium, such as, ruthenium boride or ruthenium silicide. The selected first layer 101' (i.e., the etch stop layer) can have the same thickness as that of all the other first layers 101 or can have a different thickness. For example, the selected first layer 101' can have a thickness of 1-4 nm.

In any case, the first material, the second material and the third material, as described above, can be highly reflective and, particularly, highly reflective of light at the wavelengths being used in the photolithography process at issue (e.g., highly reflective at the extreme ultraviolet (EUV) wavelength range of 11-14 nm and, particularly at the EUV wavelength of 13.5 nm) and the layers in each pair 103 of layers, including the selected pair 103', can have a combined thickness that is approximately equal to the EUV wavelength being used in the photolithography process at issue. For example, if the EUV wavelength is 13.5 nm, then the combined thickness of the layers in each pair of layers can be 6.5-7 nm. Thus, each pair 103 of layers, including the selected pair 103', effectively forms a EUV mirror.

As mentioned above, the repairable photomask structure 100 can further have a protective layer 140. The protective layer 140 can be on and immediately adjacent to the uppermost layer in the multilayer stack 150. The protective layer 140 can be made of the same third material as the selected first layer 101' (i.e., the etch stop layer) or a different material (i.e., a fourth material). In any case, the material of the protective layer 140 can be different from the first material, the second material and the light absorbing material(s) of the light absorber layer 160 (as discussed below). Specifically, the material of the protective layer 140 can have different etching characteristics than the first material, the second material, and the light absorbing material(s) of the light absorber layer 160 and can be highly reflective at the wavelengths being used in the photolithography process at issue (e.g., highly reflective at the extreme ultraviolet (EUV) wavelength range of 11-14 nm). For example, the material of the protective layer 140 can be ruthenium with an atomic number of 44 or an alloy of ruthenium, such as, ruthenium boride or ruthenium silicide. Like the selected first layer 101', the protective layer 140 can have a thickness of, for example, 1-4 nm.

As mentioned above, the repairable photomask structure 100 can further have a light absorber layer 160. The light absorber layer 160 can be on the protective layer 140 and can be made of light absorbing material(s) that absorb light and, particularly, that absorb light at the wavelengths being used in the photolithography process at issue (e.g., that absorbs light at the extreme ultraviolet (EUV) wavelength range of 11-14 nm and, particularly, at the EUV wavelength of 13.5 nm). Exemplary light absorbing materials can include, but are not limited to, chromium, nickel, titanium, tantalum, aluminum, palladium, or light absorbing alloys thereof. Thus, the light absorber layer 160 can include, for example, one or more layers of tantalum boron nitride, tantalum nitride and/or tantalum oxynitride.

Figure 3:
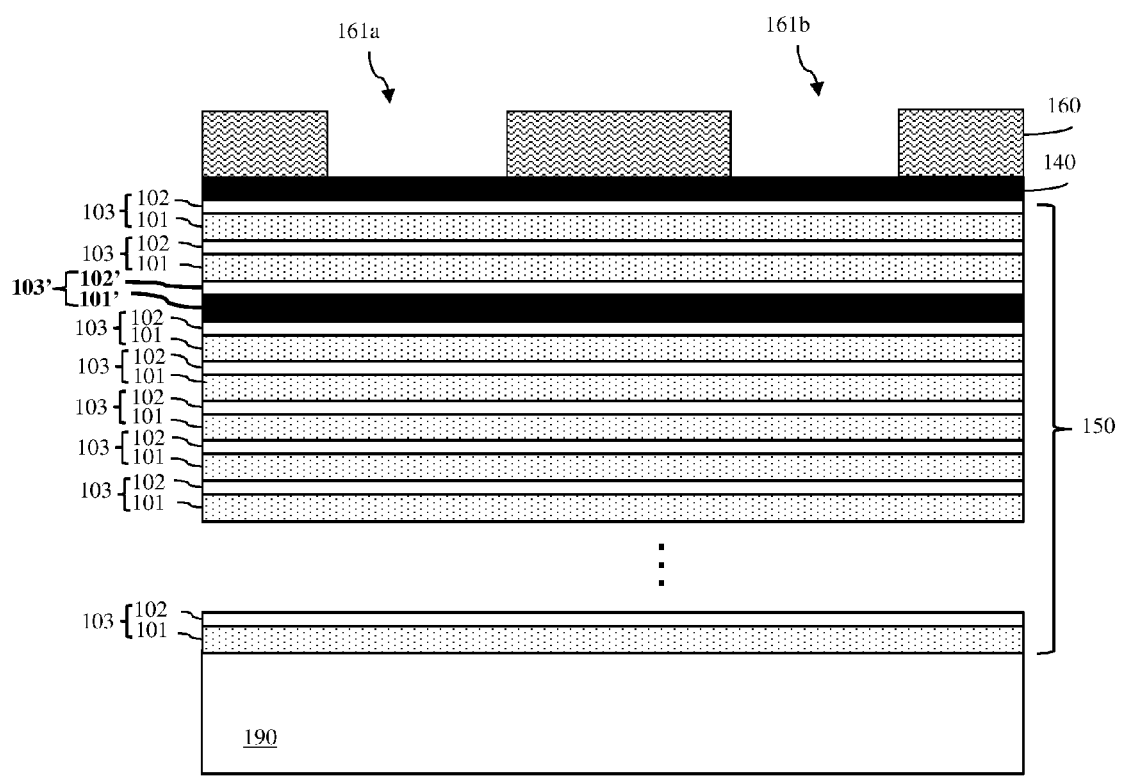
FIG. 3 is a cross-section diagram illustrating the repairable photomask structure of FIG. 1 following patterning of the light absorber layer.

It should be noted that in multilayer stack 150, described above, the total number of pairs 103 of layers, including the selected pair 103' (i.e., the total number of EUV mirrors) can be between 20 and 80 pairs. Furthermore, the selected first layer 101' can be any of the first layers 101 from the $2^{nd}$ first layer as counted down from the protective layer 140 to the $2^{nd}$ to last first layer as counted down from the protective layer 140. Preferably, the selected first layer 101' will be closer to the protective layer 140 than the substrate 190 such that there are a greater number of pairs 103 of layers below the selected pair 103' than above. For example, given a total of 40 pairs of layers, the $3^{rd}$ first layer (as counted down from the protective layer 140) can be the selected first layer 101', as illustrated in FIG. 3. Thus, 37 pairs of layers are below the selected pair 103' and 2 pairs of layers are above the selected pair 103'.

Figure 2:
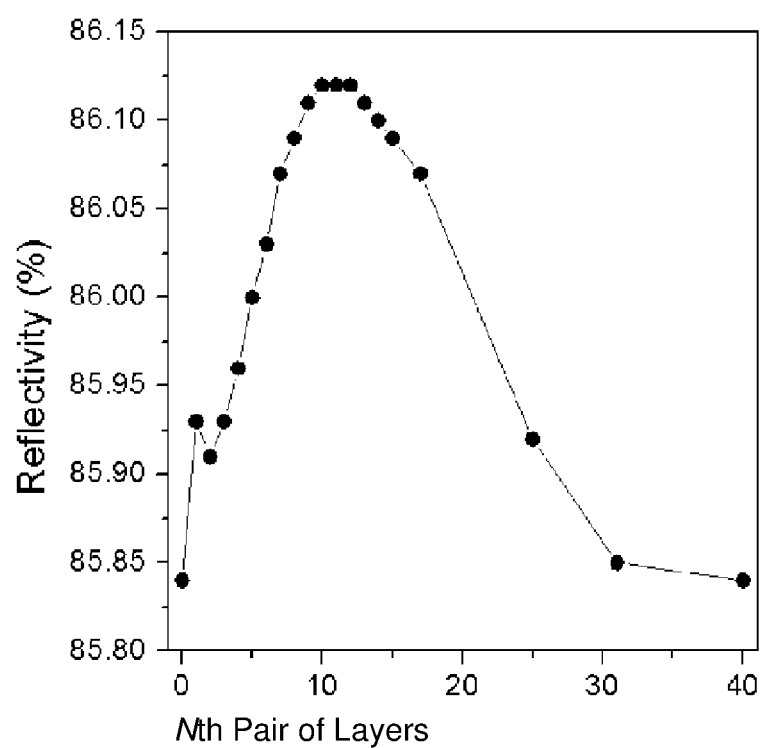
FIG. 2 is a graph illustrating changes in overall reflectivity percentage of a multilayer stack as a function of replacing a molybdenum first layer in a selected Nth one of multiple pairs of layers with a ruthenium etch stop layer.

It should also be noted that, depending upon which pair of layers is the selected pair 103' and, thus, which first layer is the selected first layer 101' (i.e., the etch stop layer), depending upon the thickness of the selected first layer 101' and further depending upon the third material used for the selected first layer 101', there may be no loss in the overall reflectivity percentage of the multilayer stack 150 and, instead, there may be a gain in the overall reflectivity percentage. For example, FIG. 2 refers to a multilayer stack with 40 pairs of layers, wherein each pair of layers includes a first layer of a relatively high atomic number material (e.g., molybdenum) and a second layer of a relatively low atomic number material (e.g., silicon), and is a graph illustrating changes in the overall reflectivity percentage of this multilayer stack as a function of replacing a molybdenum first layer in a selected Nth one of the pairs of layers (as counted down from the protective layer) with a 2 nm ruthenium etch stop layer. As illustrated, the reflectivity percentage of the multilayer stack without an etch stop layer (where the first layers in all of the pairs are made of molybdenum) is approximately 85.83%. Similarly, the reflectivity percentage of the multilayer stack when the molybdenum first layer in the 40th pair of layers is replaced by a 2 nm ruthenium etch stop layer is also is approximately 85.83%. However, the reflectivity percentage of the multilayer stack is above 85.90% when the molybdenum first layer in any of the 1st through the 25th pairs of layers is replaced by a 2 nm ruthenium etch stop layer. For example, the reflectivity percentage of the multilayer stack when the molybdenum first layer in the 15th pair of layers is replaced by a 2 nm ruthenium etch stop layer is approximately 86.125%.

Since there is no loss of reflectivity, the above-described photomask structure 100 can be readily used in a photolithography process and, particularly, in an extreme ultraviolet (EUV) photolithography process. Generally, for an EUV photolithography process, the light absorber layer 160 is patterned and etched so as to have one or more openings 161a-161b that extend vertically there through to the protective layer 140, as shown in FIG. 3. For purposes of illustration two openings are shown; however, it should be understood that any number of one or more openings could alternatively be formed. In any case, the pattern of the openings 161a-161b in the light absorber layer 160 can correspond to the desired pattern to be transferred into a feature layer on a semiconductor wafer.

Figure 4:
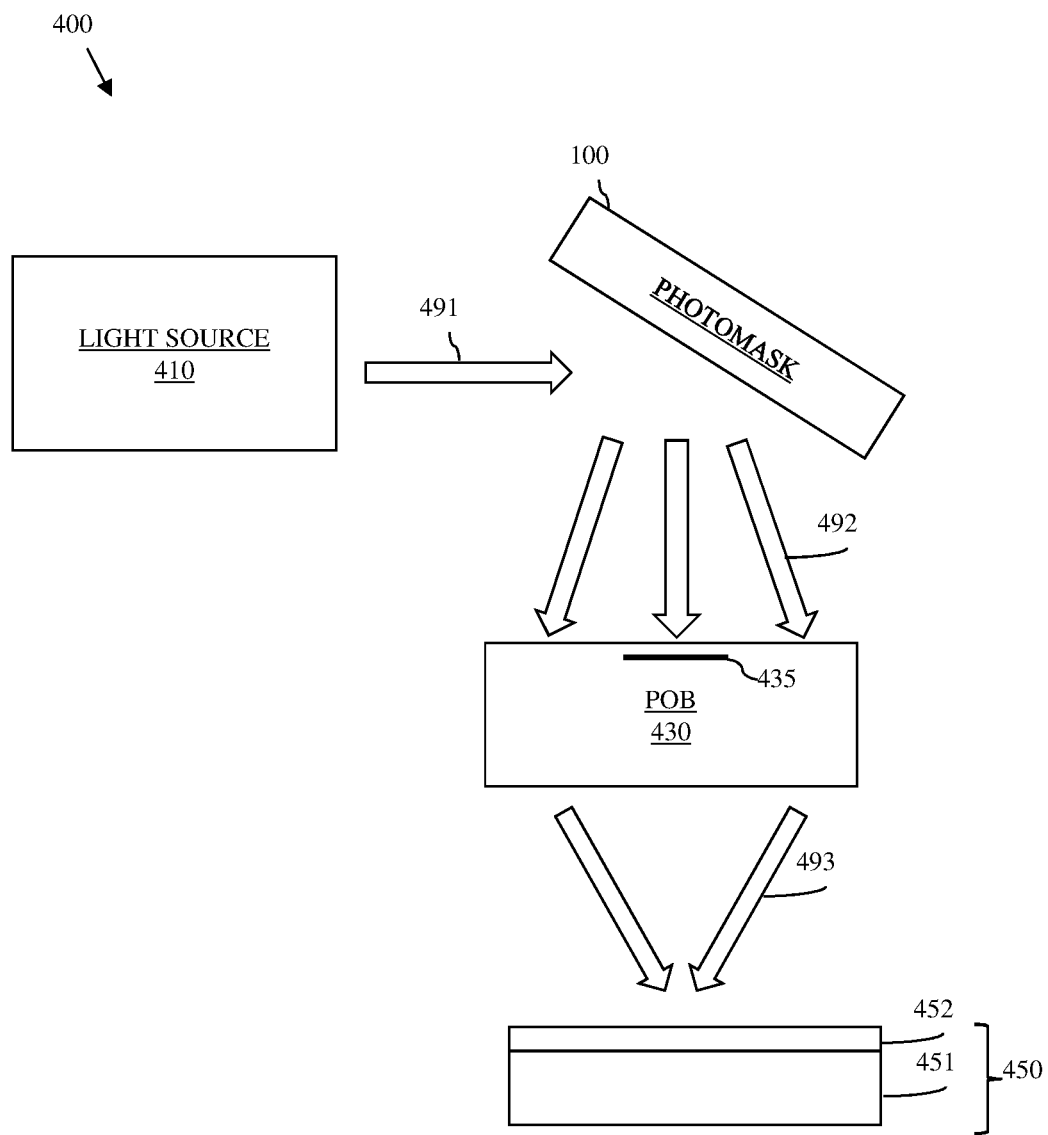
FIG. 4 is a schematic diagram illustrating an exemplary extreme ultraviolet (EUV) photolithography system.

FIG. 4 is a diagram illustrating an exemplary EUV photolithography system 400. Referring to FIG. 4 in combination with FIG. 3, the system 400 can include a light source 410 that exposes the photomask structure 100 and, particularly, the light absorber layer 160 and the exposed portions of the multilayer stack 150 within the openings 161a-161b, as described above and illustrated in FIG. 3, to light 492 and, particularly, to EUV light with a wavelength (λ) in the range of 11-14 nm (e.g., with a λ=13.5 nm). Those skilled in the art will recognize that reflected light 492 from the photomask structure 100 would be diffracted into various diffraction orders due to the presence of the pattern of openings 161, which allow light to be reflected off exposed surfaces of the multilayer stack 150 within the openings 161. It should be noted that the LTEM substrate 190 of the photomask structure 100 prevents distortion of the reflected light 492 due to heating of the photomask structure 100 when exposed to the EUV light 491. The system 400 can further include a projections optics box (POB) 430 (also referred to as a projections optics assembly) that receives (i.e., captures or collects) reflected light 492 from the photomask structure 100. The POB 430 can incorporate a filter 435, which controls the light intensity distribution of the reflected light 492 from the photomask structure 100 by, for example, removing non-diffracted light and which directs the filtered light 493 so as to expose a target 450. Such EUV photolithography systems are well known in the art and, thus, the specific details of the components described above including the light source 410 and POB 430 are omitted from this specification in order to allow the reader to focus on the salient aspects of the disclosed invention.

In any case, the target 450 can be a photosensitive layer 452 above a feature layer 451 to be patterned. The feature layer 451 can be any layer on a semiconductor wafer requiring patterning during integrated circuit fabrication. For example, the feature layer can be a semiconductor layer in which trenches for isolation regions are to be patterned for defining active device regions. Alternatively, the feature layer can be a polysilicon layer to be patterned into gate conductors; a dielectric layer to be patterned with openings for vias or trenches for wires; etc. By exposing the photosensitive layer 452 to EUV light reflected off the photomask structure 100, the pattern of the openings 161a-161b in the light absorber layer 160 is transferred into the photosensitive layer 452. That is, exposure to the EUV light reflected off the photomask structure 100 causes a chemical change in the exposed regions of the photosensitive layer 452 and, as a result, either the exposed regions or unexposed regions of the photosensitive layer 452 can be selectively removed. Once the exposed regions or unexposed regions of the photosensitive layer 452 are selectively removed, an etch process can be performed in order to transfer the pattern of the remaining regions of the photosensitive layer 452 into the feature layer 451 below. It should be noted that the better reflectivity of the multilayer stack 150 in the photomask structure 100, as compared to the reflectivity of a multilayer stack without an etch stop layer, ensures that more photons are reflected onto the target 450 and, thus, allows for a greater throughput (i.e., a greater number targets to be processed per hour). However, as mentioned above, if defects are present on the top surface of the multilayer stack 150 or embedded in the multilayer stack 150 near the top surface. Such defects can function as light absorbers, rather than being reflective, and can, thus, result in errors in the pattern transferred into the photosensitive layer 452 and, subsequently, into the feature layer 451.

Figure 5:
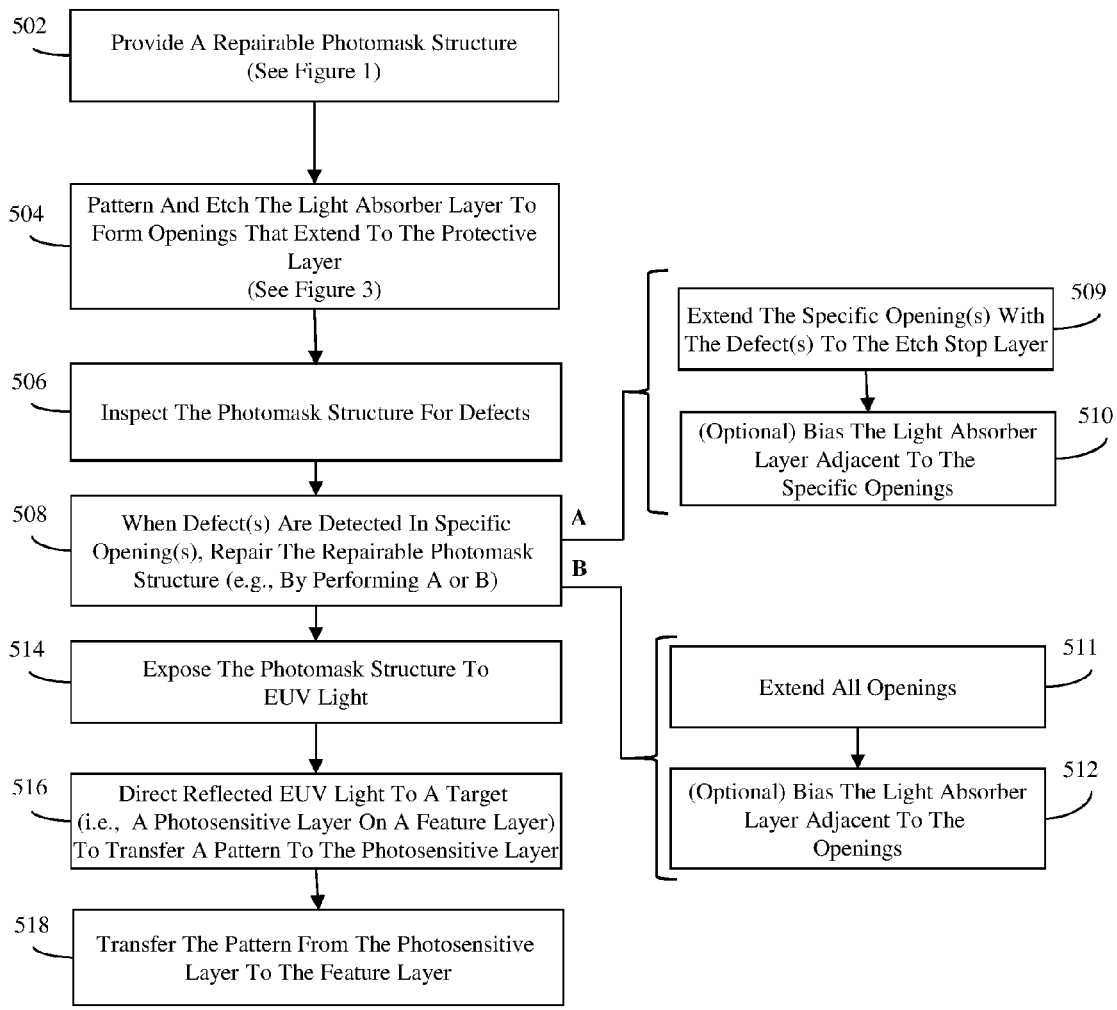
FIG. 5 is a flow diagram illustrating EUV photolithography methods using a repairable photomask structure.

Incorporation of the etch stop layer (i.e., the selected first layer 101' that is made of a different high atomic number material) into the multilayer stack 150 allows the photomask structure 100 with the patterned light absorber layer 160, as shown in FIG. 3, to be effectively repaired prior to exposing the photomask structure 100 to the light 491 if/when defects are detected near the top surface of the multilayer stack 150 in order to prevent errors in the pattern transferred into the photosensitive layer 452 and feature layer 451. More particularly, referring to FIG. 5, also disclosed herein are extreme ultraviolet (EUV) photolithography methods, which are performed using a repairable photomask structure 100 as shown in FIG. 1 and described above. In each of these methods, a photomask structure 100, as described above and illustrated in FIG. 1, can be provided (502). Next, the light absorber layer 160 can be patterned and etched to form one or more openings 161a-161b that extend vertically there through to the protective layer 140, as illustrated in FIG. 3 (504). Next, the photomask structure 100 can be inspected in order to detect any defects 165 (i.e., particles) adjacent to (i.e., at or embedded just below) exposed surfaces 162 of the multilayer stack 150 in the openings 161a-161b (506, see FIG. 6). Various tools are well known in the art for inspecting photomasks including, but not limited to, optical inspection tools, deep ultraviolet (DUV) inspection tools, midultraviolet (MUV) inspections tools, etc. Thus, the details of such inspection tools are omitted from this specification in order to allow the reader to focus on the salient aspects of the disclosed invention. Additionally, it should be understood that any suitable inspection tool could be used. For example, it is anticipated that actinic inspections tools, which are currently in development, may eventually be available for use in high volume manufacturing. When defect(s) 165 is/are detected adjacent to exposed surface(s) 162 of the multilayer stack 150 within one or more of the openings 161a-161b in the light absorber layer 160 (i.e., after and in response to detection of such detect(s) 165), the repairable photomask structure 100 can be repaired (508).

Figure 6:
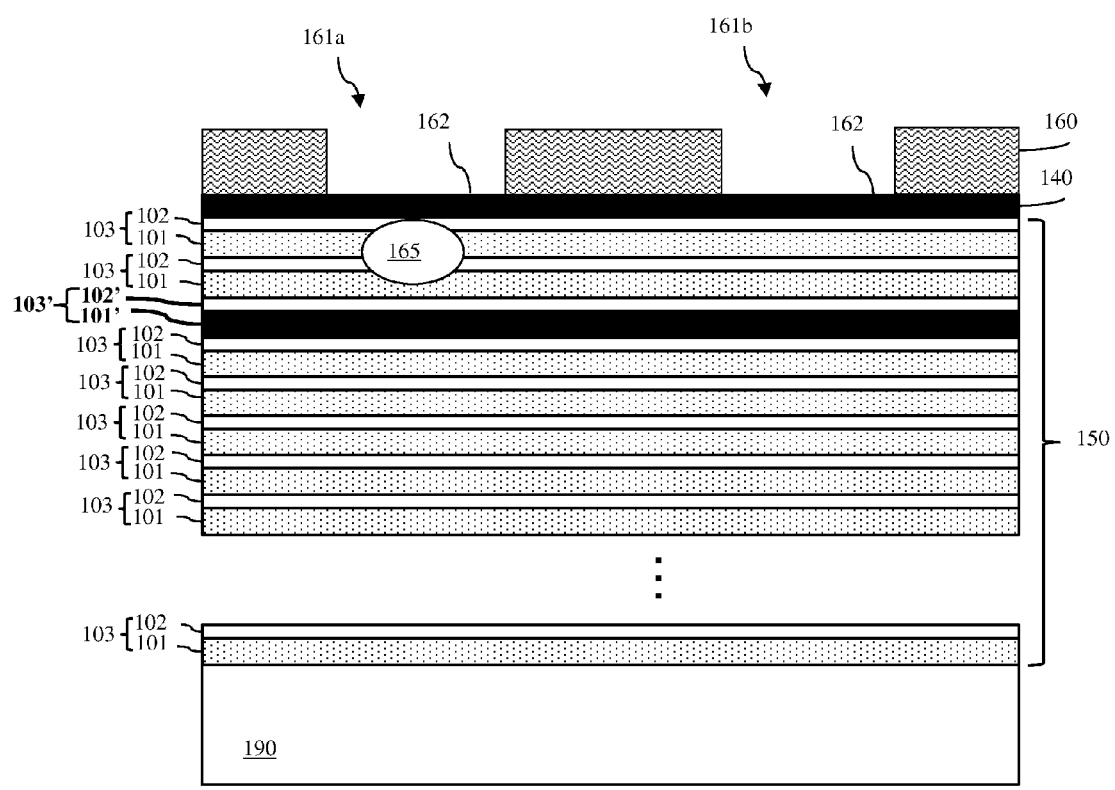
FIG. 6 is a cross-section diagram illustrating a repairable photomask structure with a detected defect.
Figure 7:
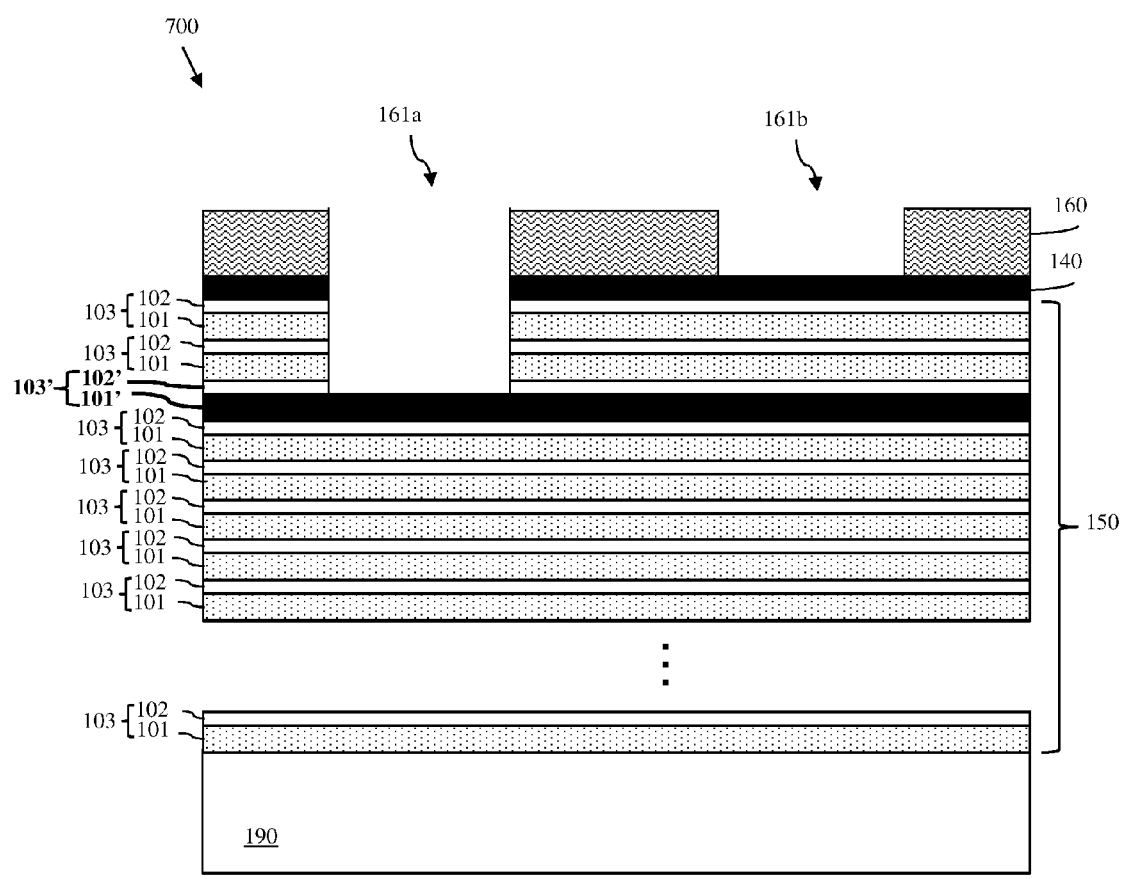
FIG. 7 is a cross-section diagram illustrating an exemplary repaired photomask structure following detection of a defect, as shown in FIG. 6.

For example, in order to repair the repairable photomask structure 100 at process 508, a defect 165 detected at process 506 in a specific opening (e.g., 161a, as shown in FIG. 6) can be selectively removed by extending that specific opening 161a in the light absorber layer 160 downward through the protective layer 140 to the selected first layer 101' (i.e., to the etch stop layer) (509, see the repaired photomask structure 700 of FIG. 7). Various different techniques can be used at process 509 to extend (i.e., deepen) the specific opening 161a, without extending other openings within which no defects were detected. For example, gas-assisted focused electron beam etching can be performed to successively and selectively remove, from the bottom surface of the specific opening 161a, exposed portions of each layer above the selected first layer 101', including the protective layer 140 and the alternating layers of the first material and the second material. It should be understood that the different materials of the layers above the selected first layer 101' can be selectively and successively removed during this gas-assisted focused electron beam etching process using different precursor materials. Alternatively, an atomic force microscopy (AFM) micromachining (also referred to as AFM nanomachining) process can be used to remove, from the bottom surface of the specific opening 161a, an exposed portion of the protective layer 140. Then, gas-assisted focused electron beam etching can be performed to successively and selectively remove, from the bottom surface of the specific opening 161a, exposed portions of each remaining layer above the selected first layer 101', including the alternating layers of the first material and the second material. Again, it should be understood that the different materials of the layers above the selected first layer 101' can be selectively and successively removed during this gas-assisted focused electron beam etching process using different precursor materials.

Figure 8:
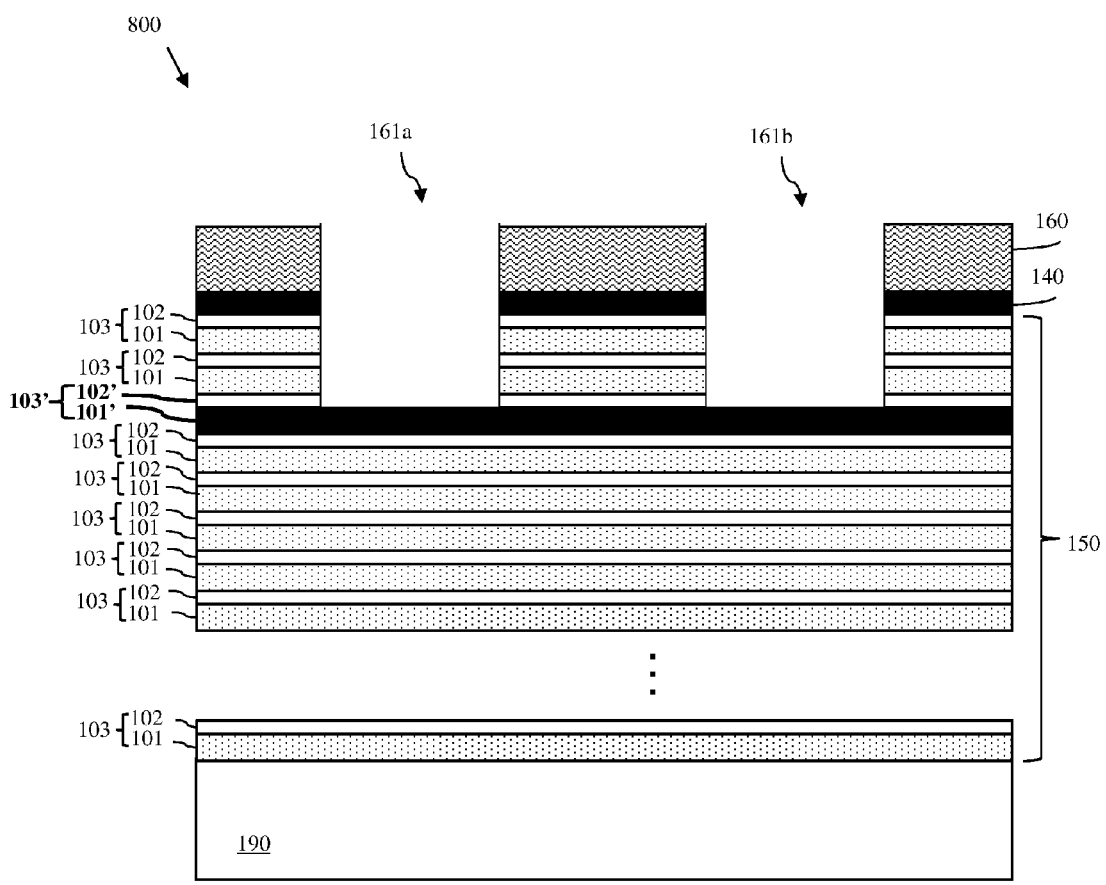
FIG. 8 is a cross-section diagram illustrating another exemplary repaired photomask structure following detection of a defect, as shown in FIG. 6.

Alternatively, in order to repair the repairable photomask structure 100 at process 508, a defect 165 detected at process 506 in a specific opening (e.g., 161a, as shown in FIG. 6) can be removed by extending all the openings 161a-161b in the light absorber layer 160 downward through the protective layer 140 to the selected first layer 101' (i.e., to the etch stop layer) (511, see the repaired photomask structure 800 of FIG. 8). For example, reactive ion etching (RIE) can be performed to successively remove, from the bottom surfaces of each of the openings 161a-161b, exposed portions of each layer above the selected first layer 101', including the protective layer 140 and the alternating layers of the first material and the second material (i.e., the first and second layers of each pair 103 of layers above the selected pair 103' and also the second layer of that selected pair 103'). It should be understood that each of the different layers of material (i.e., the material of the protective layer and the first and second materials of the first and second layers, respectively, above the selected first layer 101') can be successively and selectively removed during this RIE process using different gases.

Figure 9:
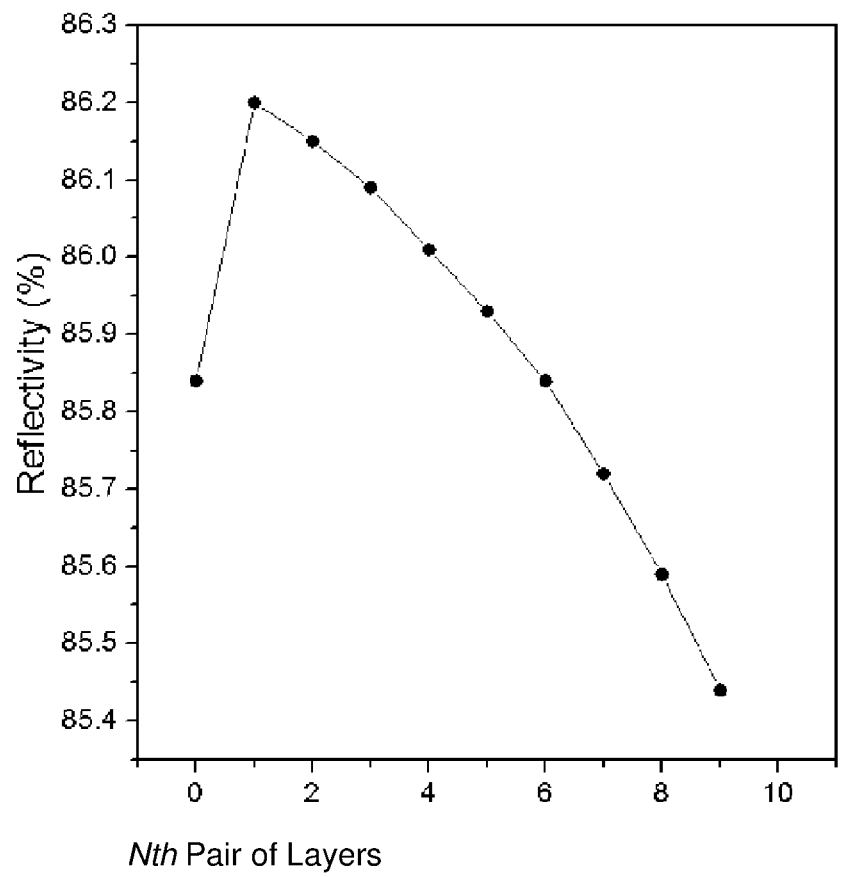
FIG. 9 is a graph illustrating changes in the reflectivity percentage of a multilayer stack as a function of replacing a molybdenum first layer in a selected Nth one of multiple pairs of layers with a ruthenium etch stop layer and performing a repair.

The repair processes 509 and 511 of selectively extending specific opening(s) or extending all openings in the light absorber layer 160 will result in a loss in reflectivity of the exposed portion of the multilayer stack 150 at the bottom of those openings. The loss of reflectivity will vary depending upon whether the selected pair 103' is the second pair or the second to the last pair in the multilayer stack and, particularly, will be greater when the selected pair 103' is farther from the protective layer 140 such that fewer pairs 103 (i.e., fewer EUV mirrors) remain intact below the bottom surface of the openings in the light absorber layer 160 following the repair process. For example, FIG. 9 refers to a multilayer stack with 40 pairs of layers, wherein each pair of layers includes a first layer of a relatively high atomic number material (e.g., molybdenum) and a second layer of a relatively low atomic number material (e.g., silicon), and is a graph illustrating changes in the reflectivity percentage as a function of replacing a molybdenum first layer in a selected $N^{th}$ one of the pairs of layers (as counted down from the protective layer) with a 2 nm ruthenium etch stop layer and performing a repair in which openings in the light absorber layer 160 are extended down to that ruthenium etch stop layer. As illustrated, the reflectivity percentage without an etch stop layer and without a repair is approximately 85.83%. The reflectivity percentage is approximately 86.2% when the $1^{st}$ molybdenum first layer as counted from the protective layer 140 is replaced by a 2 nm ruthenium etch stop layer and a repair is performed. That reflectivity percentage steadily decreases when lower molybdenum first layers are replaced by the ruthenium etch stop layer. That is, the reflectivity percentage is approximately 86.1% when the $2^{nd}$ molybdenum first layer as counted from the protective layer 140 is replaced by a 2 nm ruthenium etch stop layer and a repair is performed; the reflectivity percentage is approximately 86.1% when the $3^{rd}$ molybdenum first layer as counted from the protective layer 140 is replaced by a 2 nm ruthenium etch stop layer and a repair is performed; the reflectivity percentage is approximately 85.45% when the $9^{th}$ molybdenum first layer as counted from the protective layer 140 is replaced by a 2 nm ruthenium etch stop layer and a repair is performed; and so on.

Figure 10:
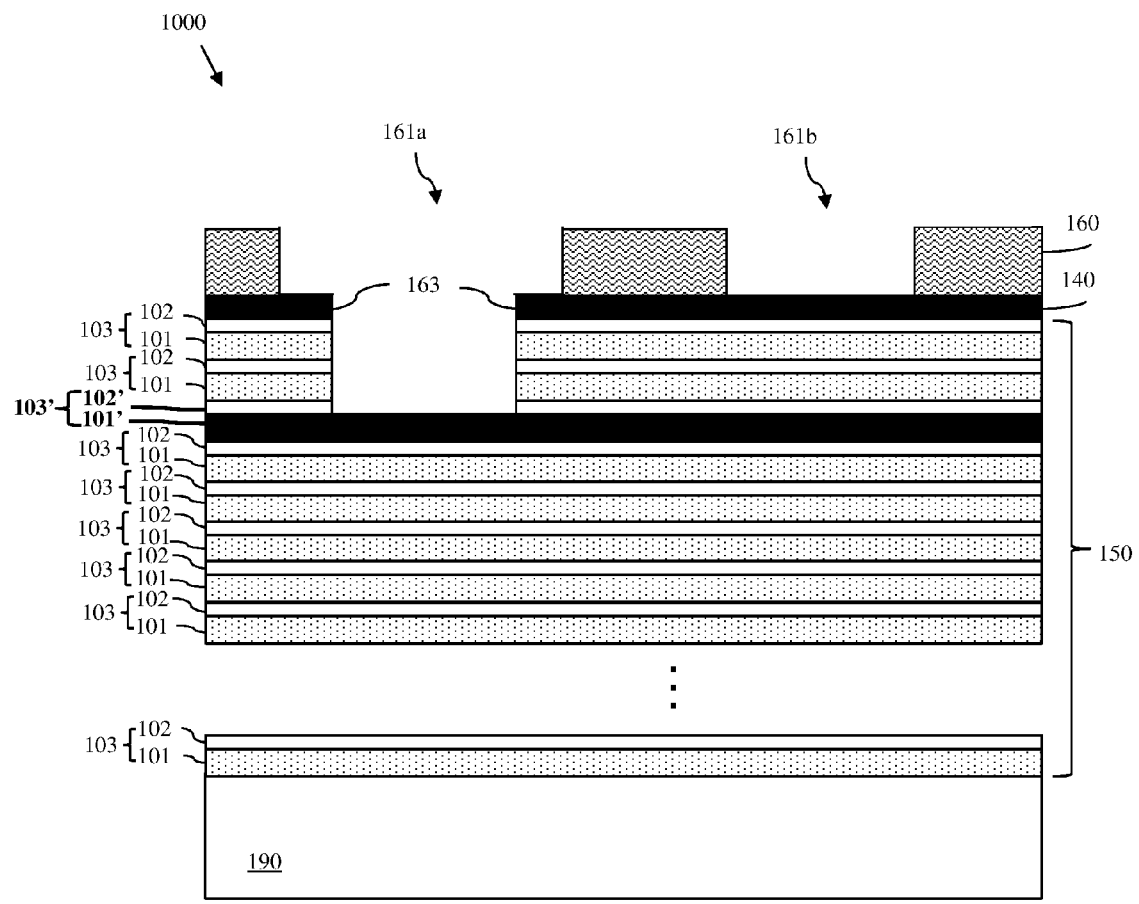
FIG. 10 is a cross-section diagram illustrating yet another exemplary repaired photomask structure following detection of a defect, as shown in FIG. 6.
Figure 11:
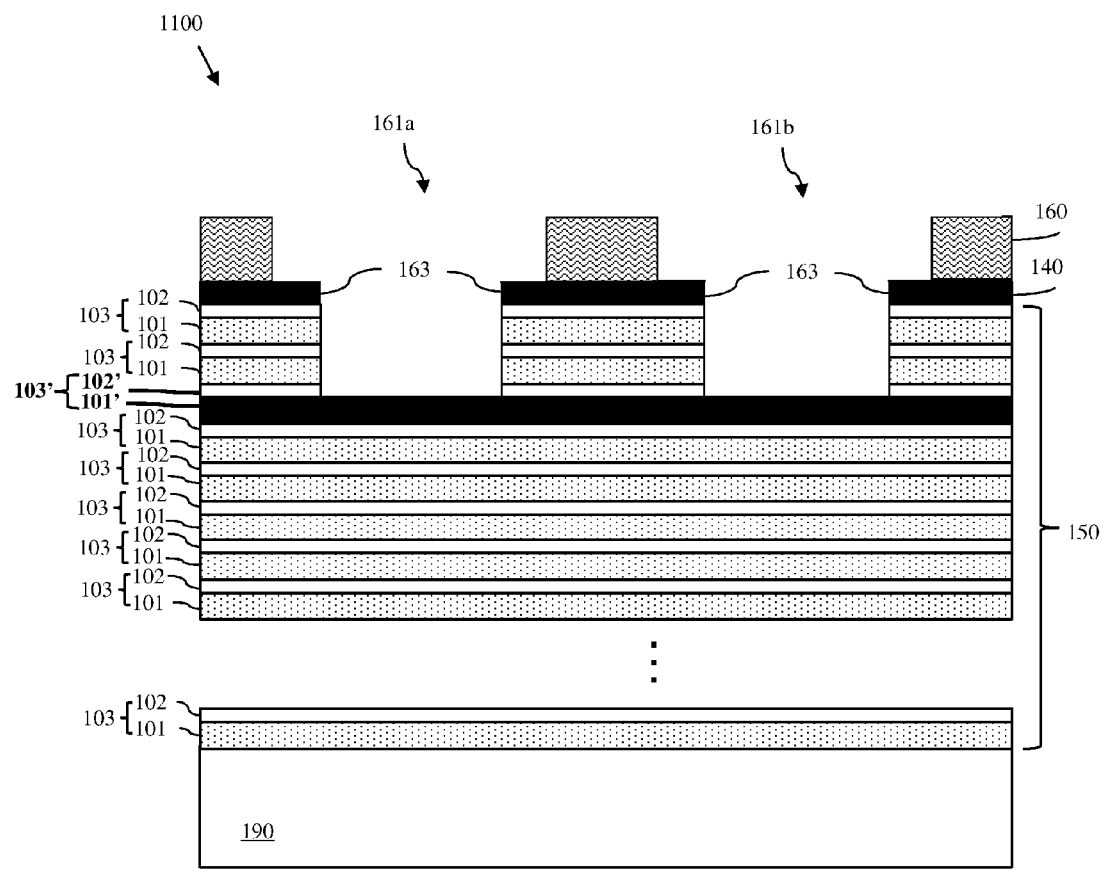
FIG. 11 is a cross-section diagram illustrating yet another exemplary repaired photomask structure following detection of a defect, as shown in FIG. 6.

If such repair processes 509 or 511 result in a reflectivity percentage that is lower than desired, additional processing can optionally be performed in order to compensate for the loss of reflectivity and/or to compensate for any shadowing effects that may occur as a result of the deeper openings. For example, following the process 509, wherein a specific opening 161a is extended in order to selectively remove a defect, the portion of the light absorber layer 160 adjacent to that specific opening 161a can be biased to regain lost light (510, see the repaired photomask structure 1000 of FIG. 10). Similarly, following the process 511, wherein all openings 161a-161b are extended in order to remove any defects, the portion of the light absorber layer 160 adjacent to all of the openings 161a-161b can be biased to regain lost light (512, see the repaired photomask structure 1100 of FIG. 11). The process of biasing the light absorber layer 160 refers to recessing the portion(s) of the light absorber layer 160 adjacent to (i.e., bordering) the edge(s) 163 (i.e., sidewalls) of the opening(s) to reduce the thickness of the light absorber layer 160 adjacent to the opening(s) or expose the protective layer 140 adjacent to the opening(s). As a result, the specific opening 161a in FIG. 10 or the openings 161a-161b in FIG. 11 will each have an upper portion, which extends partially into or entirely through the light absorber layer 160 to the protective layer 140 (as shown in FIGS. 10 and 11), and a lower portion, which extends from the upper portion down to the selected first layer 101'. The upper portion is wider than the lower portion in order to allow more light to enter the opening(s). This process of recessing the portion(s) of the light absorber layer 160 adjacent to the edge(s) 163 of opening(s) can be performed, for example, using conventional micromachining processes (i.e., by micromachining the portion(s) of the light absorber layer 160 adjacent to the edges 163 of the opening(s)).

Following repair of the repairable photomask structure at process 508, the repaired photomask structure (e.g., the repaired photomask structure 700 of FIG. 7, the repaired photomask structure 800 of FIG. 8, the repaired photomask structure 1000 of FIG. 10 or the repaired photomask structure 1100 of FIG. 11) can be used in conjunction with the EUV photolithography system 400 of FIG. 4. That is, the repaired photomask structure can be exposed by a light source 410 to light 492 and, particularly, to EUV light with a wavelength ($\lambda$) in the range of 11-14 nm (e.g., with a $\lambda$=13.5 nm) (514). Reflected light 492 from the repaired photomask structure can be filtered (e.g., by a POB 430) and the filtered light 493 can be directed (e.g., by the POB 430) so as to expose a target 450 (516). The target 450 can be a photosensitive layer 452 above a feature layer 451 to be patterned. As discussed in detail above, the feature layer 451 can be any layer on a semiconductor wafer requiring patterning during integrated circuit fabrication. By exposing the photosensitive layer 452 to EUV light reflected off the repaired photomask structure, the pattern of the opening 161a-161b in the light absorber layer 160 is transferred into the photosensitive layer 452. Subsequently, etch processes can be performed in order to transfer the pattern from the photosensitive layer 452 into the feature layer 451 below (518).

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are a repairable photomask structure and extreme ultraviolet (EUV) photolithography methods using the repairable photomask structure. As with prior art photomask structures, the repairable photomask structure disclosed herein includes a multilayer stack, a protective layer above the multilayer stack and a light absorber layer above the protective layer. The multilayer stack includes alternating layers of high and low atomic number materials. However, in the multilayer stack of the disclosed repairable photomask structure, a selected one of the high atomic number material layers is different from the others such that it can function as an etch stop layer. This configuration allows the photomask structure to be effectively repaired if/when embedded defects are detected near exposed surfaces of the multilayer stack following light absorber layer patterning. For example, when a defect is detected near an exposed surface of the multilayer stack in a specific opening in the light absorber layer, the specific opening can be extended down to the etch stop layer in order to selectively remove that defect. Alternatively, when a defect is detected near any exposed surface of the multilayer stack in any opening in the light absorber layer, all the openings can be extended down to the etch stop layer.

What is claimed is:

1. A photomask structure comprising:
   a multilayer stack on a substrate, the multilayer stack comprising:
   multiple first pairs of layers; and
   a second pair of layers that is different from the first pairs of layers,
   wherein the second pair of layers is stacked between two first pairs of layers,
   wherein each pair of the first pairs of layers and the second pair of layers comprises a first layer and a second layer on the first layer, the first layer having a higher atomic number than the second layer,
   wherein the first layer of all of the first pairs of layers comprises a first material, and
   wherein the first layer of the second pair of layers comprises a different material than the first material;
   a protective layer on the multilayer stack; and
   a light absorber layer on the protective layer.

2. The photomask structure of claim 1, the second pair of layers being positioned such that a greater number of the first pairs of layers are below the second pair of layers than above the second pair of layers.

3. The photomask structure of claim 1, the light absorber layer being patterned with multiple openings comprising at least one first opening extending vertically to the protective layer and at least one second opening extending to the first layer of the second pair of layers.

4. The photomask structure of claim 3, the light absorber layer having a first thickness adjacent to the first opening and a second thickness that is less than the first thickness adjacent to the second opening.

5. The photomask structure of claim 1, each second layer in each first pair of layers and in the second pair of layers comprising a second material that is different from the first material and the first layer in the second pair of layers comprising a third material that is different from the first material and the second material.

6. The photomask structure of claim 5, the first material comprising molybdenum.

7. The photomask structure of claim 5, the second material comprising silicon or beryllium.

8. The photomask structure of claim 5, the third material comprising ruthenium, ruthenium boride or ruthenium silicide and the protective layer comprising the third material.

9. The photomask structure of claim 1, the light absorber layer comprising chromium, nickel, titanium, tantalum, aluminum, palladium, or light absorbing alloys thereof.

10. A method comprising:
providing a photomask structure comprising:
a multilayer stack on a substrate, the multilayer stack comprising:
multiple first pairs of layers; and,
a second pair of layers that is different from the first pairs of layers,
wherein the second pair of layers is stacked between two first pairs of layers,
wherein each pair of the first pairs of layers and the second pair of layers comprises a first layer and a second layer on the first layer, the first layer having a higher atomic number than the second layer,
wherein the first layer of all of the first pairs of layers comprises a first material, and,
wherein the first layer in the second pair of layers comprises a different material than the first material;
a protective layer on the multilayer stack; and
a light absorber layer on the protective layer;
forming multiple openings that extend vertically through the light absorber layer to the protective layer;
inspecting the photomask structure to detect any defects adjacent to exposed surfaces in the openings; and,
in response to a defect being detected adjacent an exposed surface in an opening, removing the defect by extending the opening to the first layer of the second pair of layers.

11. The method of claim 10, the extending of the opening comprising:
performing gas-assisted focused electron beam etching to selectively and successively remove, from the opening, the protective layer and alternating second and first layers of any first pairs of layers above the second pair of layers stopping at the first layer of the second pair of layers, the protective layer and the alternating second and first layers being selectively and successively removed using alternating precursor materials.

12. The method of claim 10, the extending of the opening comprising:
using an atomic force microscopy micromachining process to selectively remove, from the opening, the protective layer; and
performing gas-assisted focused electron beam etching using alternating precursor materials to successively and selectively remove, from the opening, the alternating second and first layers.

13. The method of claim 10, the extending of the opening comprising:
forming a mask on the light absorber layer such that the opening is exposed; and
performing reactive ion etching with alternating gases to successively and selectively remove, from the opening, the protective layer and the alternating second and first layers.

14. The method of claim 10, further comprising recessing a portion of the light absorber layer adjacent to an edge of the opening to compensate for loss in reflectivity.

15. The method of claim 14, the recessing of the portion comprising micromachining the portion.

16. The method of claim 10, further comprising:
exposing the photomask structure to extreme ultraviolet light, the extreme ultraviolet light being reflected off the photomask structure;
directing reflected extreme ultraviolet light from the photomask structure to a target comprising a photosensitive layer on a feature layer in order to transfer a pattern from the light absorber layer into the photosensitive layer; and
performing etch processes to further transfer the pattern into the feature layer.

17. A method comprising:
providing a photomask structure comprising:
a multilayer stack on a substrate, the multilayer stack comprising:
multiple first pairs of layers; and,
a second pair of layers that is different from the first pairs of layers,
wherein the second pairs of layers is stacked between two first pairs of layers,
wherein each pair of the first pairs of layers and the second pairs of layers comprises a first layer and a second layer on the first layer, the first layer having a higher atomic number than the second layer,
wherein the first layer of all of the first pairs of layers comprises a first material, and
wherein the first layer of the second pair of layers comprises a different material than the first material;
a protective layer on the multilayer stack; and
a light absorber layer on the protective layer;
forming multiple openings that extend vertically through the light absorber layer to the protective layer;
inspecting the photomask structure to detect any defects adjacent to exposed surfaces of the openings; and,
in response to a defect being detected adjacent any exposed surface in any opening, removing the defect by extending all the openings to the first layer of the second pair of layers.

18. The method of claim 17, the extending of all the openings comprising performing reactive ion etching with alternating gases to successively and selectively remove, from all the openings, the protective layer and alternating second and first layers of any first pairs of layers above the second pair of layers stopping at the first layer of the second pair of layers.

19. The method of claim 18, further comprising recessing portions of the light absorber layer adjacent to edges of the openings to compensate for loss in reflectivity.

20. The method of claim 18, further comprising:
exposing the photomask structure to extreme ultraviolet light, the extreme ultraviolet light reflecting off the photomask;
directing reflected extreme ultraviolet light from the photomask structure to a target comprising a photosensitive layer on a feature layer in order to transfer a pattern from the light absorber layer into the photosensitive layer; and
performing etch processes to further transfer the pattern into the feature layer.

\* \* \* \* \*

UNITED STATES PATENT AND TRADEMARK OFFICE
CERTIFICATE OF CORRECTION

PATENT NO. : 9,791,771 B2
APPLICATION NO. : 15/041476
DATED : October 17, 2017
INVENTOR(S) : Qi et al.

Page 1 of 1

It is certified that error appears in the above-identified patent and that said Letters Patent is hereby corrected as shown below:

On the Title Page

(54) Should read:

"A PHOTOMASK STRUCTURE WITH AN ETCH STOP LAYER THAT ENABLES REPAIRS OF DETECTED DEFECTS THEREIN AND EXTREME ULTRAVIOLET (EUV) PHOTOLITHOGRAPHY METHODS USING THE PHOTOMASK STRUCTURE"

Signed and Sealed this
Twenty-first Day of November, 2017

Joseph Matal
*Performing the Functions and Duties of the
Under Secretary of Commerce for Intellectual Property and
Director of the United States Patent and Trademark Office*